(12) United States Patent
Anzai et al.

(10) Patent No.: US 10,615,156 B2
(45) Date of Patent: Apr. 7, 2020

(54) POWER MODULE

(71) Applicant: CALSONIC KANSEI CORPORATION, Saitama-shi, Saitama (JP)

(72) Inventors: Takeshi Anzai, Saitama (JP); Yutaka Satou, Saitama (JP)

(73) Assignee: CALSONIC KANSEI CORPORATION, Saitama-Shi (JP)

( * ) Notice: Subject to any disclaimer, the term of this patent is extended or adjusted under 35 U.S.C. 154(b) by 0 days.

(21) Appl. No.: 16/322,436

(22) PCT Filed: Jul. 28, 2017

(86) PCT No.: PCT/JP2017/027519
§ 371 (c)(1),
(2) Date: Jan. 31, 2019

(87) PCT Pub. No.: WO2018/025777
PCT Pub. Date: Feb. 8, 2018

(65) Prior Publication Data
US 2019/0181128 A1    Jun. 13, 2019

(30) Foreign Application Priority Data
Aug. 1, 2016   (JP) .................................. 2016-150965

(51) Int. Cl.
*H01L 23/495*   (2006.01)
*H01L 25/18*   (2006.01)
(Continued)

(52) U.S. Cl.
CPC .............. *H01L 25/18* (2013.01); *H01L 25/07* (2013.01); *H02M 7/003* (2013.01);
(Continued)

(58) Field of Classification Search
CPC combination set(s) only.
See application file for complete search history.

(56) References Cited

U.S. PATENT DOCUMENTS

2006/0071860 A1    4/2006  Hozoji et al.
2012/0327609 A1   12/2012  Kitamoto

FOREIGN PATENT DOCUMENTS

JP    2004-063675 A    2/2004
JP    2006-074918 A    3/2006
(Continued)

*Primary Examiner* — Robert G Bachner
(74) *Attorney, Agent, or Firm* — Foley & Lardner LLP

(57) ABSTRACT

A power module includes: a first conductive plate (23*u*, 23*v*, 23*w*) on which first switching devices (29*u*, 29*v*, 29*w*) and first rectifying devices (20*c*) are mounted, the first conductive plate having an alternating-current terminal (100*u*, 100*v*, 100*w*) for alternating-current electrical power; a second conductive plate (23*a*) on which second switching devices (28*u*, 28*v*, 28*w*) and second rectifying devices (20*c*) are mounted, the second conductive plate having a direct-current positive electrode terminal (120*a*) for direct-current electric power; and a third conductive plate (23*b*) connected to the first switching devices and the first rectifying devices, the third conductive plate having a direct-current negative electrode terminal for direct-current electric power, wherein a first direction in which a plurality of the first switching devices are arranged is perpendicular to a second direction in which a plurality of the first rectifying devices are arranged, and the alternating-current terminal extends in the second direction from a position where the first rectifying devices are arranged.

7 Claims, 7 Drawing Sheets

(51) Int. Cl.
 *H01L 25/07* (2006.01)
 *H02M 7/00* (2006.01)
 *H02M 7/797* (2006.01)
 *H02M 7/5387* (2007.01)

(52) U.S. Cl.
 CPC ............... *H01L 2224/48247* (2013.01); *H01L 2924/181* (2013.01); *H02M 7/5387* (2013.01); *H02M 7/797* (2013.01)

(56) References Cited

FOREIGN PATENT DOCUMENTS

| | | |
|---|---|---|
| JP | 2006-109576 A | 4/2006 |
| JP | 2013-008757 A | 1/2013 |

POWER MODULE

CROSS-REFERENCE TO RELATED APPLICATIONS

This application is a National Phase of International Patent Application No. PCT/JP2017/027519 filed on Jul. 28, 2017, which claims priority to Japanese Patent Application No. 2016-150965 filed on Aug. 1, 2016. The contents of these applications are herein incorporated by reference in their entirety.

TECHNICAL FIELD

The present invention relates to a power module that is mounted on electric vehicles, hybrid automobiles, and so forth for converting electrical power.

BACKGROUND ART

Power converters mounted on electric vehicles, hybrid automobiles, and so forth are provided with electronic components such as power modules, condensers, and so forth. There has been a problem in that the size of a housing of the power converter is increased due to the size and/or shape of each of these components.

A power module disclosed in JP2006-109576A includes switching devices, rectifying devices (diodes), and conductors, such as bus bars etc., for connecting these components. In order to address the above-described problem, for example, JP2006-109576A discloses an inverter device in which: first and second wiring layers of each arm are respectively formed on insulating substrates; one side of the switching device is fixed to the first wiring layer; electrical connection between the second wiring layer and the other side of the switching device is achieved by a plate-shaped conductor; the plate-shaped conductor has first and second connecting portions; the first connecting portion of the plate conductor is fixed to the other side of the switching device; and the second connecting portion of the plate conductor is fixed to the second wiring layer.

SUMMARY OF INVENTION

In the conventional technique described in JP2006-109576A, the power module is made thinner by a configuration in which a plurality of switching devices and diodes are aligned in the lateral direction on each of the upper and lower arms, and these are connected by being sandwiched between the plate-shaped conductors.

However, with such a configuration, although it is possible to secure a space for drawing out signal wires connected to the switching devices, because signal wires are not drawn out for the diodes, there is an excessive space in the longitudinal direction. As a result, there is a problem in that the size of the power module is increased.

An object of the present invention is to reduce the size of the power module.

According to one aspect of the present invention, a power module includes: a first conductive plate on which first switching devices and first rectifying devices are mounted, the first conductive plate having an alternating-current terminal for alternating-current electrical power; a second conductive plate on which second switching devices and second rectifying devices are mounted, the second conductive plate having a direct-current positive electrode terminal for direct-current electric power; and a third conductive plate connected to the first switching devices and the first rectifying devices, the third conductive plate having a direct-current negative electrode terminal for direct-current electric power, wherein a first direction in which a plurality of the first switching devices are arranged is perpendicular to a second direction in which a plurality of the first rectifying devices are arranged, and the alternating-current terminal extends in the second direction from a position where the first rectifying devices are arranged.

In the above-mentioned aspect, because the alternating-current terminal extends, from the position where the first rectifying devices are arranged, in the second direction in which the first rectifying devices are arranged, even when the switching devices are arranged in close proximity to the rectifying devices, the alternating-current terminal is not provided where the first switching devices are provided. Thus, it is possible to easily arrange the signal lines, etc. Therefore, it is possible to arrange the switching devices and the rectifying devices in close proximity to each other, and so, it is possible to reduce the size of the power module.

DESCRIPTION OF EMBODIMENTS

An embodiment according to the present invention will be described below with reference to the drawings.

Figure 1:
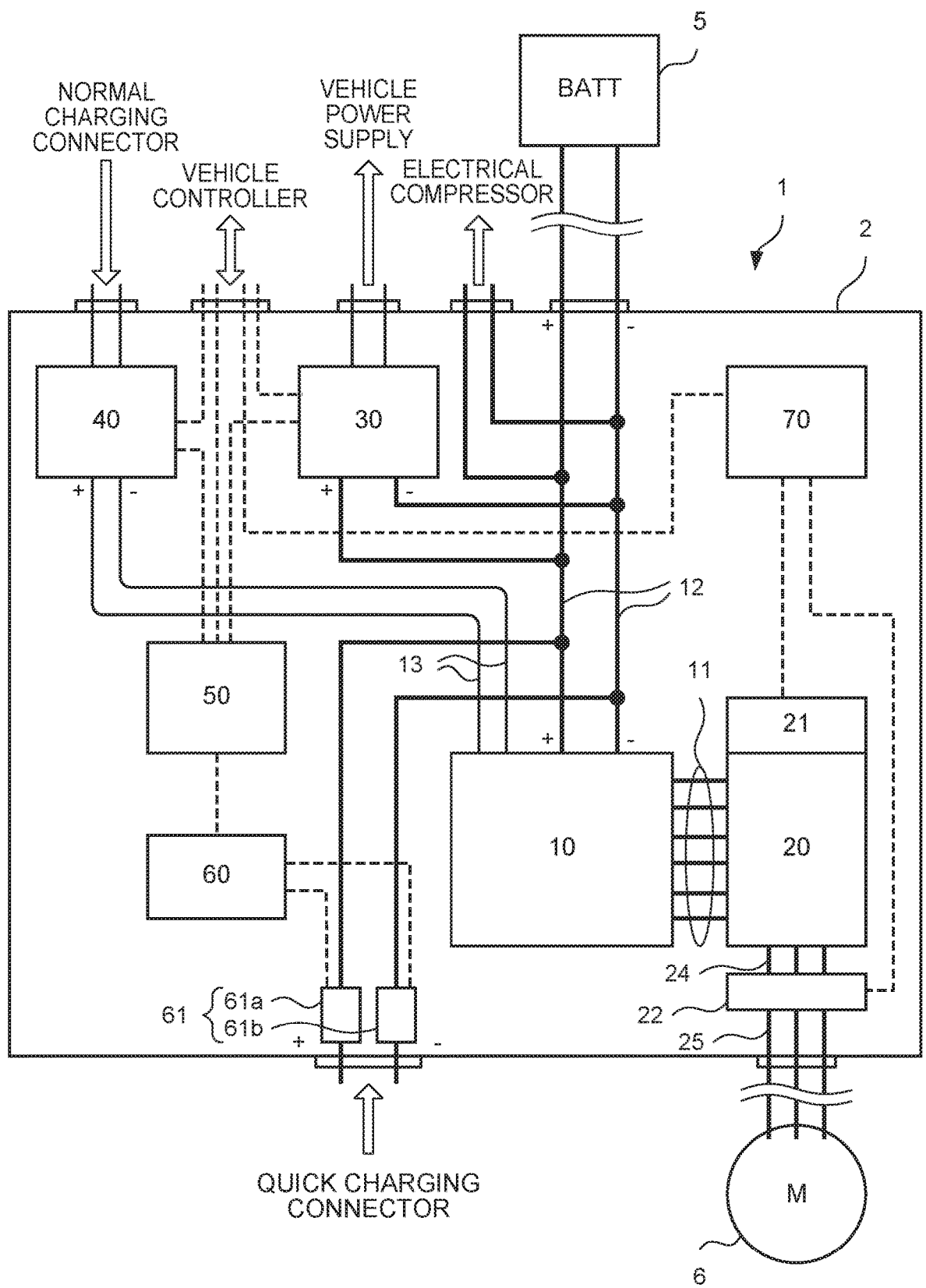
FIG. 1 is a functional block diagram of a power control unit of an embodiment according to the present invention.

FIG. 1 is a functional block diagram of a power control unit 1 of an embodiment according to the present invention.

The power control unit 1 is provided in an electric vehicle or a plug-in hybrid vehicle, and converts electrical power from a power storage apparatus (battery) 5 to electrical power suitable for driving a dynamo-electric machine (motor generator) 6. The motor generator 6 serving as a load is driven by electrical power supplied from the power control unit 1, and thereby, the vehicle is driven.

The power control unit 1 converts regenerative electrical power from the motor generator 6 to direct-current electric power and charges the battery 5 therewith. In addition, the power control unit 1 charges the battery 5 by supplying electrical power through a quick charging connector or a normal charging connector provided on the vehicle.

The battery 5 is formed of, for example, a lithium ion secondary battery. The battery 5 supplies direct-current electric power to the power control unit 1, and the battery 5 is charged by direct-current electric power supplied by the power control unit 1. The voltage of the battery 5 varies over a range from 240 to 400 V, for example, and the battery 5 is charged when by voltage higher than this voltage range is input.

The motor generator 6 is configured as, for example, a permanent magnet synchronous motor. The motor generator 6 is driven by alternating-current electric power supplied by the power control unit 1, and thereby, the vehicle is driven. When the vehicle slows down, the motor generator 6 generates regenerative electrical power.

The power control unit 1 includes, in a case 2, a capacitor module 10, a power module 20, a DC/DC converter 30, a charger 40, a DC/DC charge controller 50, a relay controller 60, and an inverter controller 70. Each of these components are connected electrically by bus bars or wires.

The capacitor module 10 is formed of a plurality of capacitor devices. The capacitor module 10 performs removal of noise and suppression of voltage fluctuation by smoothing the voltage. The capacitor module 10 is provided with first bus bars 11, second bus bars 12, and electrical power wires 13.

The first bus bars 11 are connected to the power module 20. The second bus bars 12 are connected to the DC/DC converter 30, relays 61, the battery 5, and an electric compressor (not shown). The electrical power wires 13 are formed of flexible cables (for example, litz wires) and are connected to the charger 40. The first bus bars 11, the second bus bars 12, and the electrical power wires 13 share the positive electrode and the negative electrode in the capacitor module 10.

Figure 2:
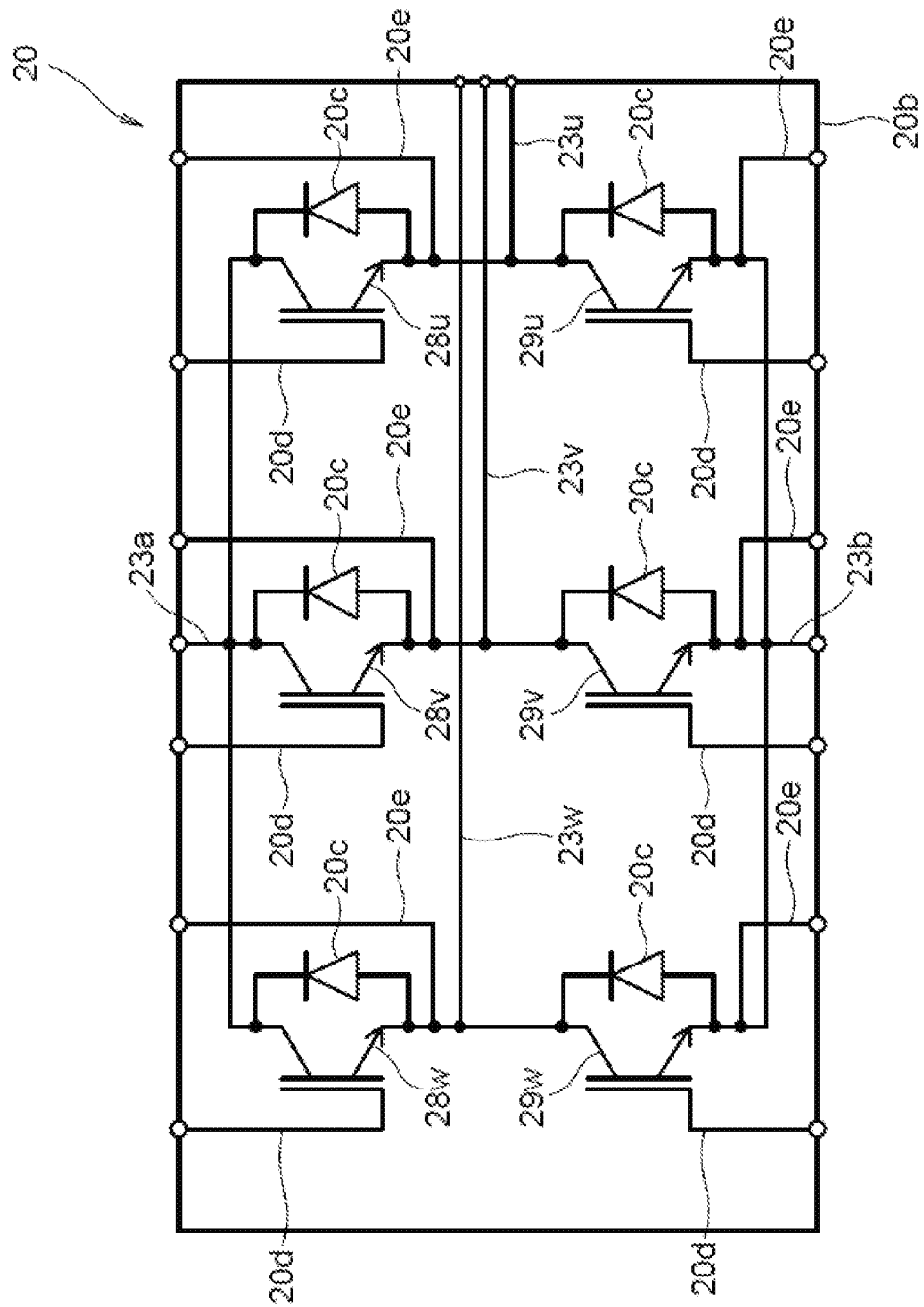
FIG. 2 is an explanatory diagram showing a circuit configuration of a power module of the embodiment according to the present invention.

The power module 20 mutually converts direct-current electric power and alternating-current electric power by turning ON/OFF a plurality of switching devices (power devices, see FIG. 2). ON/OFF control of the plurality of switching devices is performed by a driver substrate 21 provided in the power module 20.

The power module 20 is connected to the first bus bars 11 of the capacitor module 10. The first bus bars 11 are formed of positive electrodes and negative electrodes. The power module 20 is provided with three-phase output bus bars 23 formed of U-phase, V-phase, and W-phase. The output bus bars 23 are connected to a current sensor 22. The current sensor 22 is provided with motor-side bus bars 25 that output three-phase alternating-current electric power to the motor generator 6 side.

The inverter controller 70 outputs to the driver substrate 21 a signal for operating the power module 20 on the basis of an instruction from a controller (not shown) of the vehicle and detection result of the electric current of the U-phase, the V-phase, and the W-phase from the current sensor 22. The driver substrate 21 controls the power module 20 on the basis of the signal from the inverter controller 70. An inverter module that mutually converts direct-current electric power and alternating-current electric power is formed of the inverter controller 70, the driver substrate 21, the power module 20, and the capacitor module 10.

The DC/DC converter 30 converts voltage of direct-current electric power supplied from the battery 5 and supplies it to other devices. The DC/DC converter 30 lowers voltage of direct-current electric power from the battery 5 (for example, 400 V) to 12 V direct-current electric power. Direct-current electric power voltage of which has been lowered is supplied as a power supply to a controller, lighting, fan, and so forth mounted on the vehicle. The DC/DC converter 30 is connected to the capacitor module 10 and the battery 5 via the second bus bars 12.

The charger 40 converts commercial power supply (for example, AC 100 V and 200 V) that is supplied from an external charging connector provided in the vehicle via a normal charging connector 81 to direct-current electric power (for example, 500 V). Direct-current electric power converted by the charger 40 is supplied from the electrical power wires 13 to the battery 5 via the capacitor module 10. With such a configuration, the battery 5 is charged.

The DC/DC charge controller 50 controls driving of the motor generator 6 and charging of the battery 5 performed by the power control unit 1. Specifically, on the basis of the instruction from the controller of the vehicle, the DC/DC charge controller 50 controls the charging of the battery 5 by the charger 40 via the normal charging connector 81, charging of the battery 5 via a quick charging connector 63, the driving of the motor generator 6, and the lowering of voltage by the DC/DC converter 30.

A relay controller 60 controls on/off of the relays 61 by the control performed by the DC/DC charge controller 50. The relays 61 are formed of a positive-side relay 61a and a negative-side relay 61b. The relays 61 allow conduction of electricity when connection at the external charging connector is established via the quick charging connector 63 and supplies direct-current electric power (for example 500 V) supplied from the quick charging connector to the second bus bars 12. The battery 5 is charged by direct-current electric power thus supplied.

A case 2 is formed of an upper case and a bottom case. The bottom case is formed with a coolant-water flow channel. The coolant-water flow channel is configured such that cooling water can flow through, and thereby, the power module 20, the DC/DC converter 30, and the charger 40 that are mounted directly above the coolant-water flow channel are cooled.

Next, the configuration of the power module 20 will be described.

Figure 3:
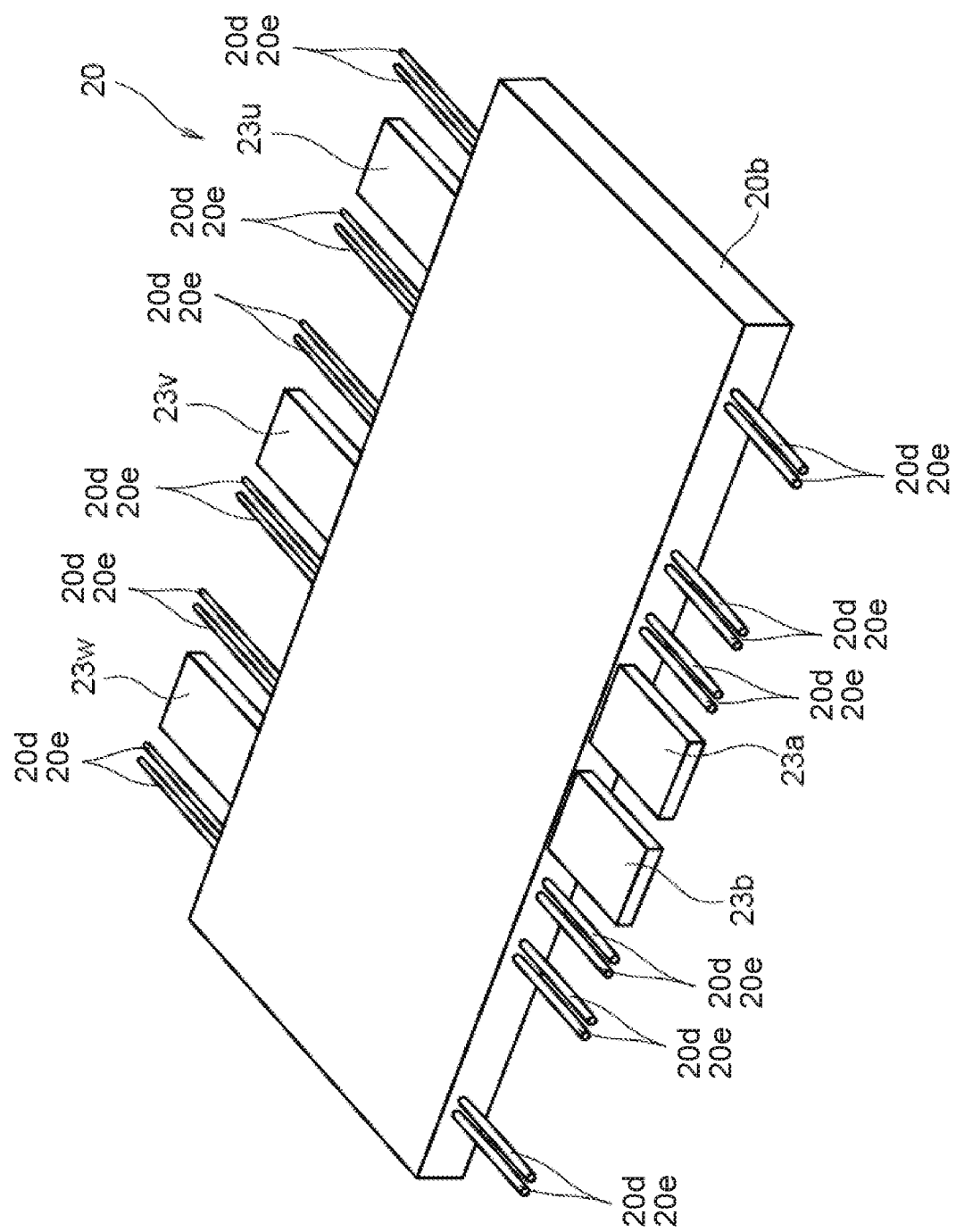
FIG. 3 is a perspective view of the power module of the embodiment according to the present invention.

FIG. 2 is an explanatory diagram showing a circuit configuration of the power module 20 of the embodiment according to the present invention. FIG. 3 is a perspective view of the power module 20.

The power module 20 is provided with a plurality of switching devices 28u to 29w formed of sets of upper arms and lower arms that respectively correspond to the U phase, the V phase, and the W phase, diodes 20c that are respectively connected to the switching devices 28u to 29w in parallel, and a resin molded portion 20b that encapsulates the switching devices 28u to 29w and the diodes 20c.

Specifically, the power module 20 is provided with the switching devices 28u and 29u that correspond to the U-phase, the switching devices 28v and 29v that correspond to the V-phase, and the switching devices 28w and 29w that correspond to the W-phase.

The power module 20 is provided with a positive-electrode bus bar 23a, a negative-electrode bus bar 23b, a U-phase bus bar 23u, a V-phase bus bar 23v, and a W-phase bus bar 23w that are respectively connected to the switching devices 28u to 29w. Signal lines 20d and signal lines 20d are connected to each of the switching devices 28u to 29w. Control signals for switching are input and output through the signal lines 20d, and signals for a temperature sensor and a current sensor are input and output through the signal lines 20e. These signal lines and bus bars project out towards the side of the resin molded portion 20b. The positive-electrode bus bar 23a and the negative-electrode bus bar 23b are connected to the first bus bars 11. The U-phase bus bar 23u, the V-phase bus bar 23v, and the W-phase bus bar 23w are connected to the current sensor 22.

As shown in FIG. 3, the power module 20 is formed to have a rectangular shape having a thin plate shape such that the positive-electrode bus bar 23*a* and the negative-electrode bus bar 23*b* project out from a first side of side surfaces in the width-wise direction, and the U-phase bus bar 23*u*, the V-phase bus bar 23*v*, and the W-phase bus bar 23*w* project out from a second side on the opposite side of the first side. The signal lines 20*d* and 20*e* respectively project out from the first side from which the positive-electrode bus bar 23*a* and the negative-electrode bus bar 23*b* project out in the same direction as each of the bus bars, or the signal lines 20*d* and 20*e* respectively project out from the second side from which the U-phase bus bar 23*u*, the V-phase bus bar 23*v*, and the W-phase bus bar 23*w* project out in the same directions as each of the bus bars. The positive-electrode bus bar 23*a*, the negative-electrode bus bar 23*b*, the U-phase bus bar 23*u*, the V-phase bus bar 23*v*, and the W-phase bus bar 23*w* project out from the power module 20 at substantially the same positions in the thickness direction of the power module 20.

Figure 4:
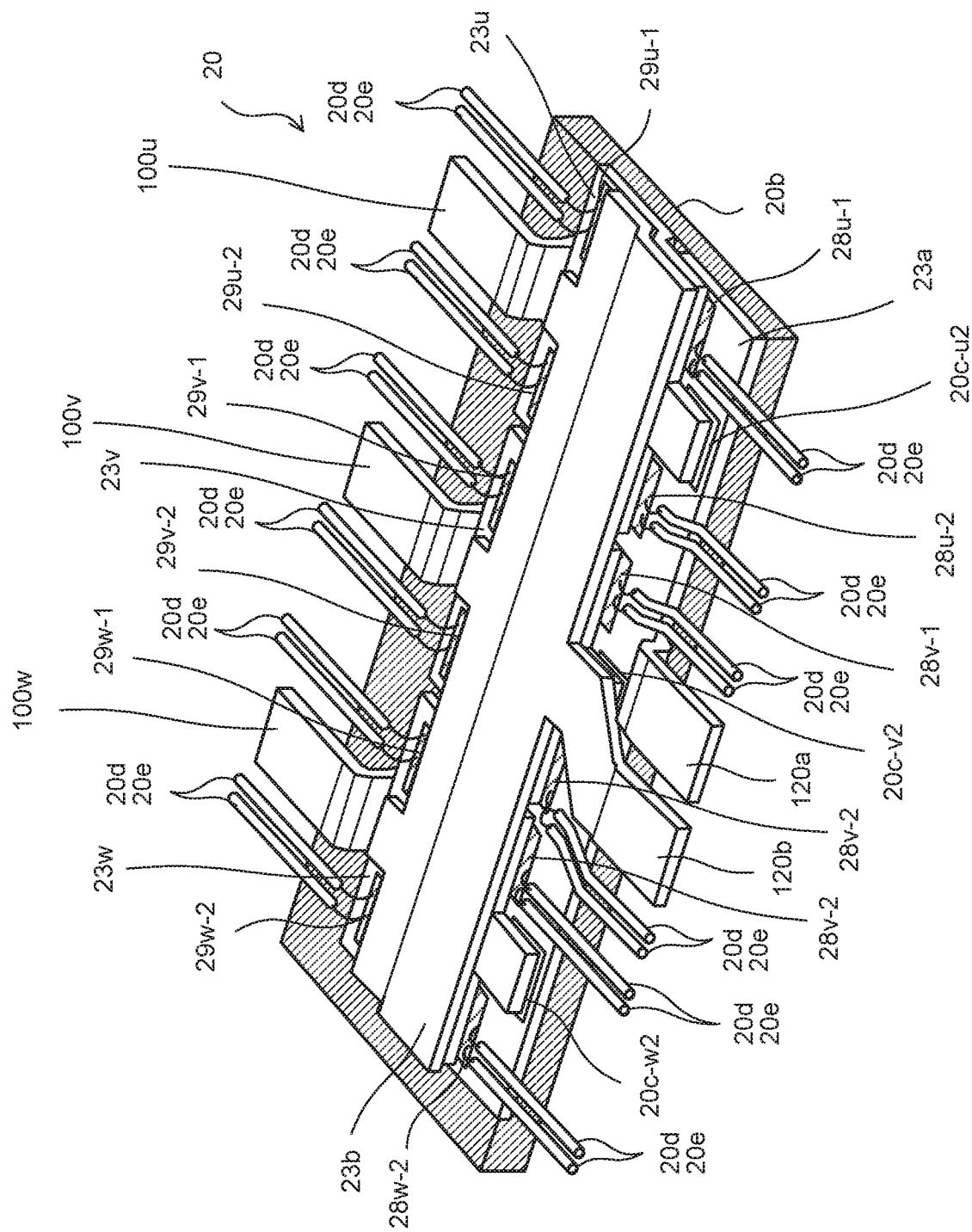
FIG. 4 is a see-through perspective view of the power module of the embodiment according to the present invention.
Figure 5:
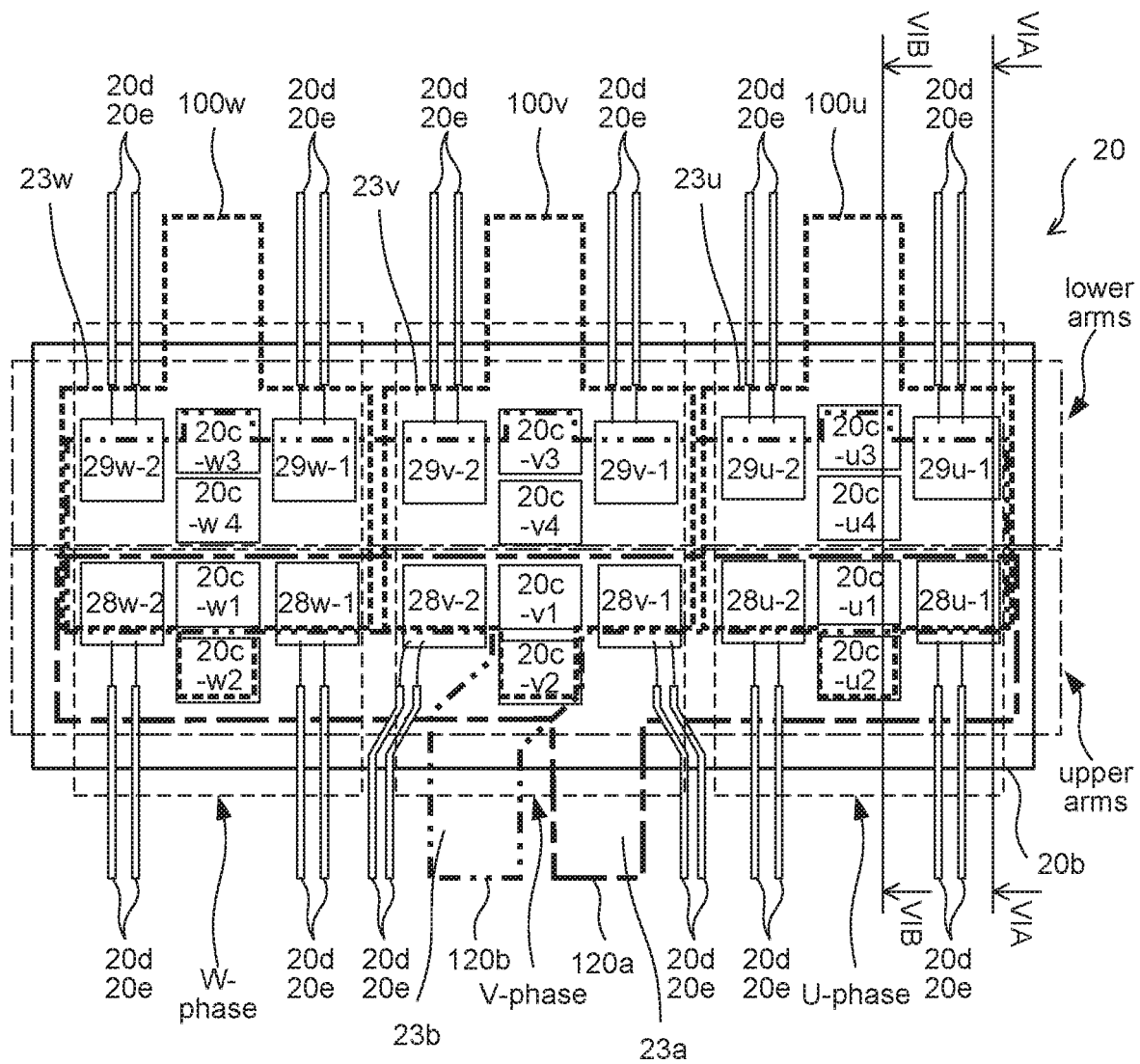
FIG. 5 is a see-through top view of the power module of the embodiment according to the present invention.

FIGS. 4 and 5 are see-through views of the power module 20 of the embodiment according to the present invention. FIG. 4 shows a see-through perspective view of the power module 20. FIG. 5 shows a see-through top view of the power module 20.

The power module 20 has a thin plate shape, and the switching devices 28*u* to 29*w* and the diodes 20*c* are arranged so as to be aligned.

Each of the switching devices in the circuit diagram shown in FIG. 2 is formed of a pair of switching devices, and each of the diodes in the circuit diagram shown in FIG. 2 is formed of a pair of diodes. Therefore, in FIG. 5, the U-phase, the V-phase, and the W-phase are each formed of the upper arm, which consists of two switching devices and two diodes, and the lower arm, which consists of two switching devices and two diodes. All of these switching devices and diodes are arranged in a flat plane in the power module 20. In this configuration, mounting areas of the diodes 20*c* are set to be smaller than mounting areas of the switching devices. With such a configuration, it is possible to increase efficiency of thermal conduction of the respective switching devices through the bus bars, etc.

The upper arm (positive electrode side) of the U phase is formed of two switching devices 28*u*-1 and 28*u*-2 and two diodes 20*c*-*u*1 and 20*c*-*u*2, and the lower arm (negative electrode side) of the U phase is formed of two switching devices 29*u*-1 and 29*u*-2 and two diodes 20*c*-*u*3 and 20*c*-*u*4.

The two switching devices 29*u*-1 and 29*u*-2 are arranged so as to be aligned in the length-wise direction of the resin molded portion 20*b* (in the first direction, i.e. in the direction parallel to the surface from which the bus bars and the signal lines project out). The diodes 20*c*-*u*3 and 20*c*-*u*4 are arranged between the two switching devices 29*u*-1 and 29*u*-2 and are arranged side by side in the width-wise direction (in the second direction, i.e. in the direction that is parallel to both side surfaces from which the bus bars and the signal lines do not project out and that is perpendicular to the first direction).

Similarly, the two switching devices 28*u*-1 and 28*u*-2 are arranged so as to be aligned in the length-wise direction of the resin molded portion 20*b*, and the diodes 20*c*-*u*1 and 20*c*-*u*2 are arranged between the two switching devices 28*u*-1 and 28*u*-2 and are arranged side by side in the width-wise direction.

The U-phase bus bar 23*u* is provided with a terminal portion 100*u* that projects out from the side surface of the resin molded portion 20*b*. The two switching devices 29*u*-1 and 29*u*-2 and the two diodes 20*c*-*u*3 and 20*c*-*u*4 are mounted on the U-phase bus bar 23*u* (see FIGS. 6*a* and 6*b*).

The switching devices 29*u*-1 and 29*u*-2 and the diodes 20*c*-*u*3 and 20*c*-*u*4 are sandwiched between the U-phase bus bar 23*u* and the negative-electrode bus bar 23*b*, thereby performing switching of conduction of electric power between the U-phase bus bar 23*u* and the negative-electrode bus bar 23*b* as the switching device 29*u* of the lower arm of the U-phase.

The terminal portion 100*u* of the U-phase bus bar 23*u* projects out in the outward direction of the resin molded portion 20*b* from the position where the diodes 20*c*-*u*3 and 20*c*-*u*4 are arranged between the two switching devices 29*u*-1 and 29*u*-2. The terminal portion 100*u* of the U-phase bus bar 23*u* is formed so as to have the width in the length-wise direction that is substantially the same as that of the diodes 20*c*-*u*3 and 20*c*-*u*4.

The signal lines 20*d* and 20*e* are respectively connected to the switching devices 29*u*-1 and 29*u*-2 by bonding wires etc. The signal lines 20*d* and 20*e* project out in the outward direction of the resin molded portion 20*b* from the positions adjacent to both sides of the terminal portion 100*u* of the U-phase bus bar 23*u* in the length-wise direction.

Figure 6A:
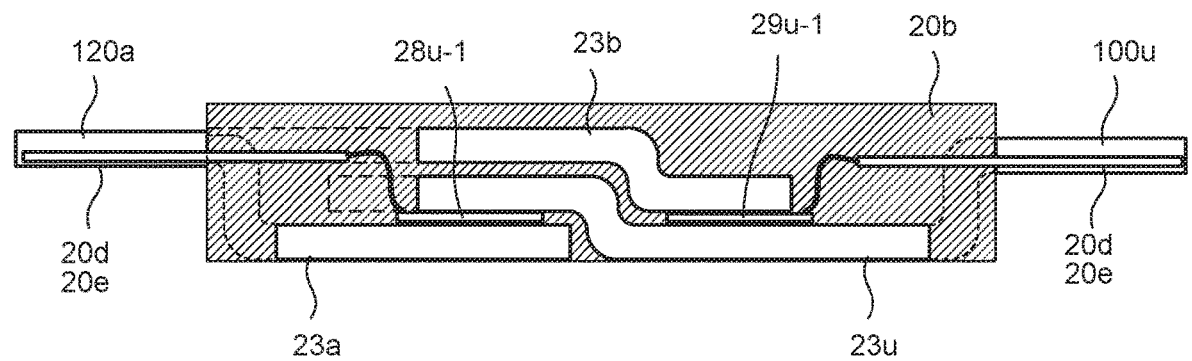
FIG. 6A is a sectional view of the power module of the embodiment according to the present invention.
Figure 6B:
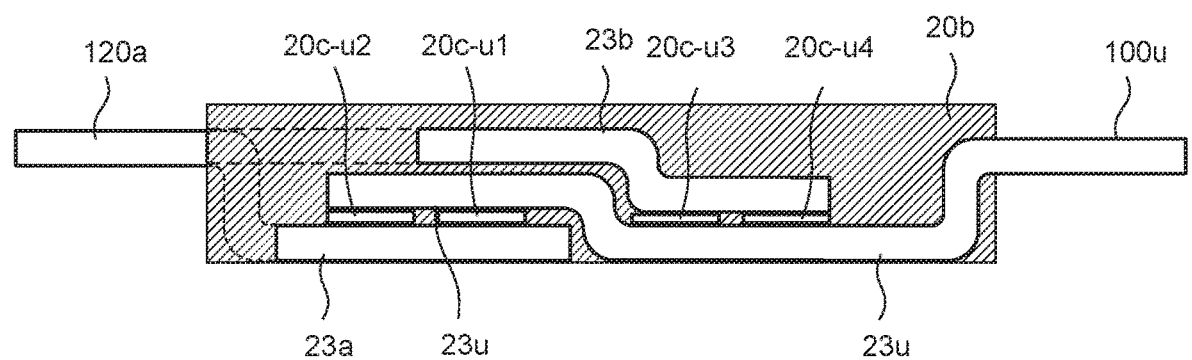
FIG. 6B is a sectional view of the power module of the embodiment according to the present invention.

Furthermore, in the U-phase, the two switching devices 28*u*-1 and 28*u*-2 are arranged in the length-wise direction (in the third direction), and the two diodes 20*c*-*u*1 and 20*c*-*u*2 are arranged in the width-wise direction (in the fourth direction), and thereby, each of them is mounted on the positive-electrode bus bar 23*a* (see FIGS. 6*a* and 6*b*). The switching devices 28*u*-1 and 28*u*-2 and the diodes 20*c*-*u*1 and 20*c*-*u*2 are sandwiched between the positive-electrode bus bar 23*a* and the U-phase bus bar 23*u* and perform switching of conduction of electric power between the positive-electrode bus bar 23*a* and the U-phase bus bar 23*u* as the switching device 28*u* of the upper arm of the U-phase.

The signal lines 20*d* and 20*e* are respectively connected to the switching devices 28*u*-1 and 28*u*-2. The signal lines 20*d* and 20*e* project out in the outward direction of the resin molded portion 20*b* from the surface at the opposite side from the surface on which the terminal portion 100*u* of the U-phase bus bar 23*u* is provided so as to project out therefrom.

The upper arm (positive electrode side) of the V phase is formed of two switching devices 28*v*-1 and 28*v*-2 and two diodes 20*c*-*v*1 and 20*c*-*v*2, and the lower arm (negative electrode side) of the V phase is formed of two switching devices 29*v*-1 and 29*v*-2 and two diodes 20*c*-*v*3 and 20*c*-*v*4.

The two switching devices 29*v*-1 and 29*v*-2 are arranged so as to be aligned in the length-wise direction of the resin molded portion 20*b*. The diodes 20*c*-*v*3 and 20*c*-*v*4 are arranged between the two switching devices 29*v*-1 and 29*v*-2 and are arranged side by side in the width-wise direction.

Similarly, the two switching devices 28*v*-1 and 28*v*-2 are arranged so as to be aligned in the length-wise direction of the resin molded portion 20*b*, and the diodes 20*c*-*v*1 and 20*c*-*v*2 are arranged between the two switching devices 28*v*-1 and 28*v*-2 and are arranged side by side in the width-wise direction.

The V-phase bus bar 23*v* is provided with a terminal portion 100*v* that projects out from the side surface of the resin molded portion 20*b*. The two switching devices 29*v*-1 and 29*v*-2 and the two diodes 20*c*-*v*3 and 20*c*-*v*4 are mounted on the V-phase bus bar 23*v*. The switching devices 29*v*-1 and 29*v*-2 and the diodes 20*c*-*v*3 and 20*c*-*v*4 are sandwiched between the V-phase bus bar 23*v* and the negative-electrode bus bar 23*b*, thereby performing switching of conduction of electric power between the V-phase bus bar 23v and the negative-electrode bus bar 23b as the switching device 29v of the lower arm of the V-phase.

The terminal portion 100v of the V-phase bus bar 23v projects out in the outward direction of the resin molded portion 20b from the position where the diodes 20c-v3 and 20c-v4 are arranged between the two switching devices 29v-1 and 29v-2. The terminal portion 100v of the V-phase bus bar 23v is formed so as to have the width in the length-wise direction that is substantially the same as that of the diodes 20c-v3 and 20c-v3.

The signal lines 20d and 20e are respectively connected to the switching devices 29v-1 and 29v-2. The signal lines 20d and 20e project out in the outward direction of the resin molded portion 20b from the positions adjacent to both sides of the terminal portion 100v of the V-phase bus bar 23v in the length-wise direction.

In the V-phase, the two switching devices 28v-1 and 28v-2 are arranged in the length-wise direction (in the third direction), and the two diodes 20c-v1 and 20c-v2 are arranged in the width-wise direction (in the fourth direction), and thereby, each of them is mounted on the positive-electrode bus bar 23a. The switching devices 28v-1 and 28v-2 and the diodes 20c-v1 and 20c-v2 are sandwiched between the positive-electrode bus bar 23a and the V-phase bus bar 23v and perform switching of conduction of electric power between the positive-electrode bus bar 23a and the V-phase bus bar 23v as the switching device 28v of the upper arm of the V-phase.

The signal lines 20d and 20e are respectively connected to the switching devices 28v-1 and 28v-2. The signal lines 20d and 20e project out in the outward direction of the resin molded portion 20b from the surface at the opposite side from the surface on which the terminal portion 100v of the V-phase bus bar 23v is provided so as to project out therefrom.

In the vicinities of areas where the switching devices 28v-1 and 28v-2 of the V-phase are arranged, a terminal portion 120a of the positive-electrode bus bar 23a and a terminal portion 120b of the negative-electrode bus bar 23b project out in the outward direction of the resin molded portion 20b. The signal lines 20d and 20e that are connected to the switching devices 28v-1 and 28v-2 are connected such that they are offset in the length-wise direction of the resin molded portion 20b so as to avoid the terminal portion 120a of the positive-electrode bus bar 23a and the terminal portion 120b of the negative-electrode bus bar 23b.

The upper arm (positive electrode side) of the W phase is formed of two switching devices 28w-1 and 28w-2 and two diodes 20c-w1 and 20c-w2, and the lower arm (negative electrode side) of the W phase is formed of two switching devices 29w-1 and 29w-2 and two diodes 20c-w3 and 20c-w4.

The two switching devices 29w-1 and 29w-2 are arranged so as to be aligned in the length-wise direction of the resin molded portion 20b. The diodes 20c-w3 and 20c-w4 are arranged between the two switching devices 29w-1 and 29w-2 and are arranged side by side in the width-wise direction.

Similarly, the two switching devices 28w-1 and 28w-2 are arranged so as to be aligned in the length-wise direction of the resin molded portion 20b, and the diodes 20c-w1 and 20c-w2 are arranged between the two switching devices 28w-1 and 28w-2 and are arranged side by side in the width-wise direction.

The W-phase bus bar 23w is provided with a terminal portion 100w that projects out from the side surface of the resin molded portion 20b. The two switching devices 29w-1 and 29w-2 and the two diodes 20c-w3 and 20c-w4 are mounted on the W-phase bus bar 23w. The switching devices 29w-1 and 29w-2 and the diodes 20c-w3 and 20c-w4 are sandwiched between the W-phase bus bar 23w and the negative-electrode bus bar 23b, thereby performing switching of conduction of electric power between the W-phase bus bar 23w and the negative-electrode bus bar 23b as the switching device 29w of the lower arm of the W-phase.

The terminal portion 100w of the W-phase bus bar 23w projects out in the outward direction of the resin molded portion 20b from the position where the diodes 20c-w3 and 20c-w4 are arranged between the two switching devices 29w-1 and 29w-2. The terminal portion 100w of the W-phase bus bar 23w is formed so as to have the width in the length-wise direction that is substantially the same as that of the diodes 20c-w3 and 20c-w4.

The signal lines 20d and 20e are respectively connected to the switching devices 29w-1 and 29w-2. The signal lines 20d and 20e project out in the outward direction of the resin molded portion 20b from the positions adjacent to both sides of the terminal portion 100w of the W-phase bus bar 23w in the length-wise direction.

Furthermore, in the W-phase, the two switching devices 28w-1 and 28w-2 are arranged in the length-wise direction (in the third direction), and the two diodes 20c-w1 and 20c-w2 are arranged in the width-wise direction (in the fourth direction), and thereby, each of them is mounted on the positive-electrode bus bar 23a. The switching devices 28w-1 and 28w-2 and the diodes 20c-w and 20c-w2 are sandwiched between the positive-electrode bus bar 23a and the W-phase bus bar 23w and perform switching of conduction of electric power between the positive-electrode bus bar 23a and the W-phase bus bar 23w as the switching device 28w of the upper arm of the W-phase.

The signal lines 20d and 20e are respectively connected to the switching devices 28w-1 and 28w-2. The signal lines 20d and 20e project out in the outward direction of the resin molded portion 20b from the surface at the opposite side from the surface on which the terminal portion 100w of the W-phase bus bar 23w is provided so as to project out therefrom.

FIGS. 6a and 6b are sectional views of the power module 20 of this embodiment and respectively show a VIA-VIA sectional view and a VIB-VIB sectional view in FIG. 5.

As shown in FIG. 6a, in the upper arm of the U phase, the switching device 28u-1 (and 28u-2) is sandwiched between the positive-electrode bus bar 23a and the U-phase bus bar 23u so as to be electrically connected to both bus bars. The signal lines 20d and 20e are connected to the switching device 28u-1 via the bonding wires. In the lower arm of the U phase, the switching device 29u-1 (and 29u-2) is sandwiched between the negative-electrode bus bar 23b and the U-phase bus bar 23u so as to be electrically connected to both bus bars. The signal lines 20d and 20e are connected to the switching device 29u-1 via the bonding wires.

As shown in FIG. 6b, in the upper arm of the U phase, the diodes 20c-u1 and 20c-u2 are sandwiched between the positive-electrode bus bar 23a and the U-phase bus bar 23u so as to be electrically connected to both bus bars. In the lower arm of the U phase, the diodes 20c-u3 and 20c-u4 are sandwiched between the negative-electrode bus bar 23b and the U-phase bus bar 23u so as to be electrically connected to both bus bars.

As shown in FIGS. 6a and 6b, with a configuration in which the switching devices and the diodes respectively have a thin shape and are respectively sandwiched between the bus bars by being arranged on the flat surface, it is possible to form the power module 20 to have a thin shape.

As described above, the embodiment according to the present invention is applied to the power module 20 that mutually converts direct-current electric power and alternating-current electric power. The power module 20 includes: a first conductive plate (the U-phase bus bar 23u, the V-phase bus bar 23v, the W-phase bus bar 23w) on which first switching devices (the switching devices 29u, 29v, 29w of the lower arm) and first rectifying devices (the diodes 20c of the lower arm) are mounted, the first conductive plate having an alternating-current terminal for alternating-current electrical power (the terminal portion 100u, 100v, or 100w); a second conductive plate (the positive-electrode bus bar 23a) on which a second switching device (the switching device 28u, 28v, 28w of the upper arm) and a second rectifying device (the diode 20c of the upper arm) are mounted, the second conductive plate having a direct-current positive electrode terminal for direct-current electric power (the terminal portion 120a); and a third conductive plate (the negative-electrode bus bar 23b) connected to the first switching devices and the first rectifying devices, the third conductive plate having a direct-current negative electrode terminal for direct-current electric power (the terminal portion 120b).

In the power module 20, when viewed in a planar view, the first switching devices and the second switching devices are arranged so as to be adjacent to each other, and the first rectifying devices and the second rectifying devices are arranged so as to be adjacent to each other.

Specifically, referring to FIG. 5, in the U-phase, the first switching devices (the switching devices 29u-1 and 29u-2 of the lower arm) and the second switching devices (the switching devices 28u-1 and 28u-2 of the upper arm) are arranged so as to be adjacent to each other. The first rectifying devices (a set of the diodes 20c-u1 and 20c-u2 of the lower arm) and the second rectifying devices (a set of the diodes 20c-u3 and 20c-u4 of the upper arm) are arranged so as to be adjacent to each other. With such a configuration, it is possible to arrange the respective devices forming the upper arm and the respective devices forming the lower arm in close proximity to each other.

In the embodiment according to the present invention, because an alternating-current terminal extends, from the position where the first rectifying devices are arranged, in the second direction in which the first rectifying devices are arranged, even when the switching devices are arranged in close proximity to the rectifying devices, the alternating-current terminal is not provided where the first switching devices are provided, and so, it is possible to easily arrange the signal lines, etc. Therefore, the switching devices and the rectifying devices can be arranged in close proximity to each other and the power module 20 can be made small, and therefore, it is possible to reduce the size of the power control unit 1 on which the power module 20 is mounted.

Although the embodiment of the present invention has been described above, the above-mentioned embodiment is only an illustration of one of application examples of the present invention, and there is no intention to limit the technical scope of the present invention to the specific configuration of the above-mentioned In the above-mentioned embodiment, although an example configuration in which a function of one switching device and a function of one diode are respectively formed by two switching devices has been shown; however, the configuration is not limited thereto. It may be possible to employ a configuration in which two or more switching devices and diodes are used so as to function as one switching device and one diode.

Figure 7:
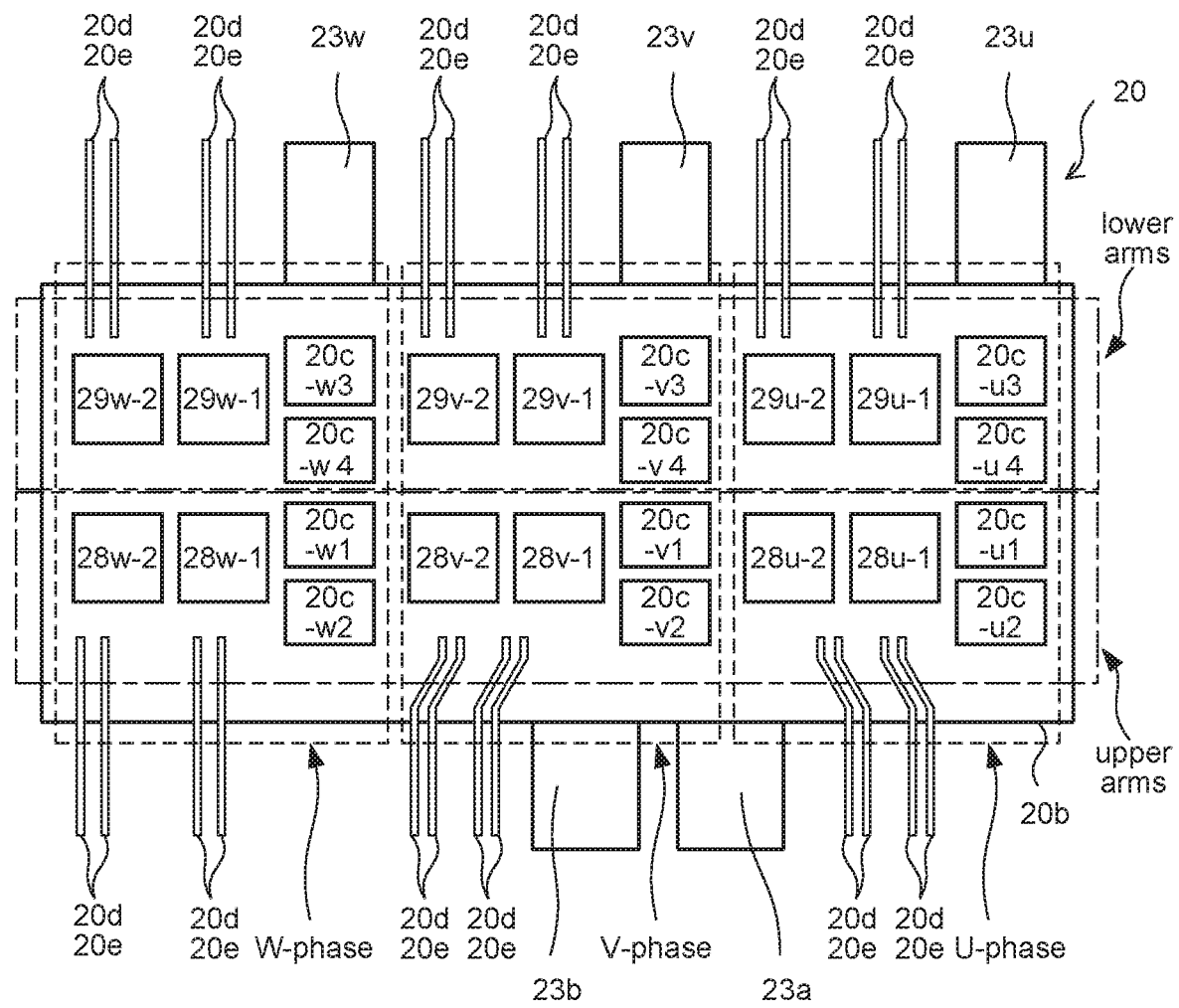
FIG. 7 is a see-through top view of a modification of the power module of the embodiment according to the present invention.

In addition, in the above-mentioned embodiment, although a configuration in which two diodes are sandwiched between two switching devices has been shown; however, the configuration is not limited thereto. FIG. 7 shows a see-through top view of the power module 20 of a modification of this embodiment. As in the modification shown in FIG. 7, it may be possible to employ a configuration in which two diodes are arranged adjacent to two switching devices, and similarly to the above-mentioned embodiment, the first direction in which the two switching devices are arranged is perpendicular to the second direction in which the two diodes are arranged.

In addition, in the above-mentioned embodiment, although a first arrangement for the first switching devices arranged in the lower arm and a third arrangement for the switching devices arranged in the upper arm are formed so as be in the same direction; however, the configuration is not limited thereto. For example, it may be possible to employ a shape in which a surface on which the switching devices of the upper arm are arranged joins at an angle with a surface on which the switching devices of the lower arm are arranged. Similarly, a second arrangement for the first rectifying devices arranged in the lower arm and a fourth arrangement for the rectifying devices arranged in the upper arm may be joined at an angle with respect to each other.

Embodiments of the present invention were described above, but the above embodiments are merely examples of applications of this invention, and the technical scope of this invention is not limited to the specific constitutions of the above embodiments.

This application claims priority based on Japanese Patent Application No. 2016-150965 filed with the Japan Patent Office on Aug. 1, 2016, the entire contents of which are incorporated into this specification.

The invention claimed is:

1. A power module for mutually converting direct-current electric power and alternating-current electrical power comprising:
a first conductive plate on which a plurality of first switching devices and a plurality of first rectifying devices are mounted, the first conductive plate having an alternating-current terminal for alternating-current electrical power;
a second conductive plate on which a second switching device and a second rectifying device are mounted, the second conductive plate having a direct-current positive electrode terminal for direct-current electric power; and
a third conductive plate connected to the first switching devices and the first rectifying devices, the third conductive plate having a direct-current negative electrode terminal for direct-current electric power, wherein
a first direction in which the first switching devices are arranged is perpendicular to a second direction in which the first rectifying devices are arranged, and
the alternating-current terminal extends in the second direction from a position where the first rectifying devices are arranged.

2. The power module according to claim 1, wherein signal lines are connected to each of the plurality of first switching devices, and
the signal lines extend in the second direction from a position different from a position of the alternating-current terminal.

3. The power module according to claim 1, wherein
the first switching devices and the first rectifying devices, and the second switching devices and the second rectifying devices are respectively provided in three sets so as to correspond to three-phase alternating-current,
the three sets of first switching devices and the first rectifying devices are arranged in the first direction, and
the three sets of second switching devices and the second rectifying devices are arranged in the first direction so as to be adjacent to the three sets of first switching devices and the first rectifying devices.

4. The power module according to claim 1, wherein
at least two of the first rectifying devices are arranged between two of the first switching devices in the second direction.

5. The power module according to claim 1, wherein
a mounting area of the first rectifying devices is smaller than a mounting area of the first switching devices.

6. The power module according to claim 1, wherein
a third direction in which a plurality of the second switching devices are arranged is perpendicular to a fourth direction in which a plurality of the second rectifying devices are arranged, and
the direct-current positive electrode terminal extends in the fourth direction from a position where the first rectifying devices are arranged.

7. The power module according to claim 6, wherein
signal lines are connected to each of the plurality of the second switching devices, and
the signal lines extend in the fourth direction from a position different from a position of the direct-current positive electrode terminal.

* * * * *